(12) United States Patent
Kobayashi et al.

(10) Patent No.: US 7,248,044 B2
(45) Date of Patent: Jul. 24, 2007

(54) MAGNETIC FLUX MEASURING APPARATUS BY HYSTERESIS CHARACTERISTIC TYPE DIGITAL FLL USING COUNTER SYSTEM FOR SQUID

(75) Inventors: Koichiro Kobayashi, Morioka (JP); Daisuke Oyama, Morioka (JP); Masahito Yoshizawa, Morioka (JP); Kenji Nakai, Morioka (JP); Takayuki Simizu, Morioka (JP); Tomoaki Ueda, Kyoto (JP)

(73) Assignee: Japan Science and Technology Agency, Kawaguchi-shi (JP)

( * ) Notice: Subject to any disclaimer, the term of this patent is extended or adjusted under 35 U.S.C. 154(b) by 0 days.

(21) Appl. No.: 11/565,848

(22) Filed: Dec. 1, 2006

(65) Prior Publication Data

US 2007/0114994 A1 May 24, 2007

Related U.S. Application Data

(63) Continuation of application No. PCT/JP2005/010141, filed on Jun. 2, 2005.

(30) Foreign Application Priority Data

Jun. 3, 2004 (JP) ............................. 2004-165903

(51) Int. Cl.
 *G01R 33/035* (2006.01)
(52) U.S. Cl. ....................... 324/248; 505/846; 505/162
(58) Field of Classification Search ................ 324/248, 324/244, 260; 505/845–846, 160, 162; 327/527–528
See application file for complete search history.

(56) References Cited

U.S. PATENT DOCUMENTS 5,532,592 A * 7/1996 Colclough .................. 324/248

FOREIGN PATENT DOCUMENTS

JP 6-289110 A 10/1994
JP 9-329656 A 12/1997

OTHER PUBLICATIONS

Dietmar Drung, "High-$T_c$ and low-$T_c$ dc SQUID electronics", Superconductor Science and Technology, vol. 16, 2003, pp. 1320-1336, Institute of Physics Publishing.

* cited by examiner

Primary Examiner—Bot LeDynh
(74) Attorney, Agent, or Firm—Oblon, Spivak, McClelland, Maier & Neustadt, P.C.

(57) ABSTRACT

In a SQUID magnetometer, high resolution, a high slew rate, and a high dynamic range are achieved without using expensive circuit components having a large number of processing bits and enabling a high speed processing operation. A digital FLL circuit using a double counter system is provided. This circuit utilizes two or more counters, for example, a change range counter in a digital FLL for carrying out a processing operation at a high speed and a reproducing counter in a control/measuring computer. In addition, in the present invention, hysteresis characteristics having a $1\Phi_0$ positive margin is used. That is, a change of a state of a magnetic flux is counted by means of a counter. At the time of this change, control is made so as to track a different channel between cases in which a magnetic flux increases and decreases, thereby stabilizing the control.

8 Claims, 6 Drawing Sheets

MAGNETIC FLUX MEASURING APPARATUS BY HYSTERESIS CHARACTERISTIC TYPE DIGITAL FLL USING COUNTER SYSTEM FOR SQUID

CROSS REFERENCE TO RELATED APPLICATIONS

This is a Continuation Application of PCT Application No. PCT/JP2005/010141, filed Jun. 2, 2005, which was published under PCT Article 21(2) in Japanese.

This application is based upon and claims the benefit of priority from prior Japanese Patent Application No. 2004-165903, filed Jun. 3, 2004, the entire contents of which are incorporated herein by reference.

BACKGROUND OF THE INVENTION

1. Field of the Invention

The present invention relates to a magnetic flux detecting apparatus of a flux locked loop (FLL) system using a superconducting ring having a Josephson junction, i.e., a superconducting quantum interference device (SQUID).

2. Description of the Related Art

An FLL system generally carries out measurement of a magnetic field by feeding a feedback current to a feedback coil additionally provided at the SQUID so that a value of a first defined lock point is maintained or so that a change rate of a magnetic flux in a superconducting ring becomes always constant. That is, in order to eliminate an external magnetic field, a feedback current is fed so that a magnetic field reversal from the external magnetic field is generated, and then, a change rate of the external magnetic field is obtained by a magnitude of this feedback current. By using an FLL apparatus, linearity data can be sampled such that an external magnetic flux to be measured and an output voltage that is a measurement value of this external magnetic flux lie in a proportional relationship.

As such a system, there is proposed a magnetic flux detecting method using a so called digital FLL system. In the digital FLL system, periodic property of $\Phi$–V characteristics of the SQUID is utilized. A large change component of a magnetic flux is measured by counting the number of periodic changes in the $\Phi$–V characteristics, and then, a small change component of the magnetic flux is linearly measured and merged. A measuring portion of the SQUID FLL apparatus is primarily configured using an AD converter, a digital integrator, a counter, a DA control converter, and a control measurement computer. In this case, in order to achieve a high resolution and a high slew rate, there is a need for expensive circuit components having a large number of processing bits and enabling a high speed processing operation. Therefore, the circuit components are formed in a digital signal processing (DSP) 22.

In such a digital FLL magnetic flux detecting method, using one counter, external magnetic flux data is expressed by merging a value expressing a magnetic flux from the number of bits based on data from the AD converter and the number of bits expressing the number of period from the counter.

FIG. 1 shows a dcSQUID magnetometer 10 using a digital FLL technology. A SQUID 11 provides two Josephson junctions 13 partway of a ring 12 made of a superconducting material, and is biased by means of a direct current Ib from a direct current power supply (not shown). Then, a voltage (output voltage V) between an input and an output of this bias current is changed by an external magnetic flux $\Phi$x that penetrates the ring 12 of the SQUID. FIGS. 2(a) and 3(a) each show a relationship between the external magnetic flux $\Phi$x and the output voltage V. The output voltage V of the SQUID 11 periodically changes in accordance with a change of the external magnetic flux $\Phi$x that penetrates the ring 12. Its period is $\Phi_0$ that is a magnetic flux quantum. In this way, the output voltage V periodically changes, and thus, a value of the external magnetic flux $\Phi$x is not uniquely defined merely by measuring an output voltage V.

Thus, as shown in FIG. 2(a), there is used a method for carrying out measurement including a periodic change of a magnetic flux from an arbitrary measurement start point "$a_0$" (generally called "lock point"). That is, there is employed a system of calculating a value of the external magnetic flux $\Phi$x based on the number "n" of periodic changes based on the external magnetic flux and a change component $\Phi'$ of the magnetic flux in a maximum period $a_n$. In general, each lock point is defined at a point of a voltage equal to another one for each period. This lock point can be arbitrarily set in accordance with convenience of a data processing operation, and it is not always necessary to be V=0, as illustrated in FIG. 2.

In order to measure values that correspond to periodic property and a change component $\Phi'$, as shown in FIG. 2B, a change component $\Delta v$ of an output voltage is obtained, the $\Delta v$ corresponding to a magnetic flux change component $\Delta \Phi$ from a lock point $a_n$ of a certain moment, and then, the thus obtained change component is always fed back to a feedback coil 20 via an integrator circuit. Thus, a measurement point is fixed to the lock point $a_n$, and the change $\Delta v$ of the output voltage based on the change $\Delta \Phi$ of the magnetic flux at the time of each measurement becomes always constant. Thus, as shown in FIG. 2C, a voltage change component V' corresponding to the change component $\Phi'$ of the magnetic flux can be obtained as linearity data. If this data value exceeds a control range of a lock point, the current lock point moves to a next lock point, and at the same time, previous integral data in the integrator is reset.

In an example of FIG. 1, an output voltage V of the SQUID 11 is amplified by means of an amplifier 14, and the thus amplified output voltage is converted to digital data by means of an AD converter 15. The digital data is integrated by means of a digital integrator 16. If an integral value exceeds a control range of each lock point, the value is reset. In accordance with the reset count, up to what period of data is obtained is measured by means of a counter 17. An integral value of each period is fed back to the feedback coil 20 via a voltage/current converter 19 for generating a feedback current "If" defined in response to characteristics of a DA converter 18 and the SQUID 11. In addition, each integral value reset by lock points ($a_0$, $a_1$, $a_2$ ... $a_n$) of each period is fed to a data merge unit 21. The feedback current "If" is reset for each period, and thus, does not increase to a predetermined value or more.

The data merge unit 21 calculates a value of a magnetic field that corresponds to the reset count measured by the counter 17 and a value of the magnetic field that corresponds to a voltage change component V' obtained from the digital integrator 16 in a last period, sums these values, and then, obtains the value of the external magnetic flux. Control of the AD converter 15, the digital integrator 16, the counter 17, and the data merge unit 21 is generally carried out by means of a control unit (not shown) of the DSP 22.

In addition, in the digital FLL, the control range of lock points is defined as $\pm 1\Phi_0$ of control lock points ($a_0$, $a_1$, $a_2$ ... $a_n$), as shown in FIG. 3(b). Then, in the case where the magnetic flux $\Phi$ has exceeded this range, there is used a method for shifting a lock point, recording UP and DOWN information by means of the counter 17, and then, carrying out control (feedback). In this method, stabilization of an operation of switching a control range is attempted by utilizing so called hysteresis characteristics in which lock point and voltage change paths are different between cases in which an external magnetic flux increases and decreases.

Non-patent document 1: Dietmar Drung "HIGH-Tc and low-Tc dc SQUID electronics" Superconductor Science and Technology 16 (2003) 1320-1136

BRIEF SUMMARY OF THE INVENTION

The digital FLL apparatus, as shown in FIG. 1, uses only one counter 17. In the case where one counter is thus used in the digital FLL, the number of bits is restricted by the number of bits of hardware such as DSP (in general, a total number of 32 bits is used for counter bits and feedback bits). Thus, there has been a problem that a large number of bits cannot be assigned. In addition, in the case where the counter 17 is configured in a control computer, there is a need for transferring data within one shift. Thus, there has been a problem that a slew rate cannot be increased because a limitation depending on a data transfer speed applies.

In addition, the SQUID digital FLL apparatus is composed of an AD converter 15, a digital integrator 16, a counter 17, a DA converter 18, a control/measurement computer 22 and the like. In the digital FLL, the number of bits determines a resolution and a dynamic range, and thus, a design is made in consideration of a measurement object or an environmental noise level. Thus, there has been a problem that, in order to obtain a high resolution, a high slew rate and a high dynamic range, it is unavoidable to use expensive components capable of carrying out a high speed processing operation at a high bit rate or to use a DSP.

The resolution of the system is determined depending on the control range and the number of bits for control. In the case where the number of bits is constant, there is a need for narrowing the control rage in order to improve a resolution. In such a technique, in order to make a stable operation, $\pm 1\Phi_0$ (equivalent to two periods) is defined as a control range, as shown in FIG. 3(b), with respect to each lock point. However, in the digital FLL, as shown in FIGS. 5(a) and 5(b), $\pm 0.5\Phi_0$ can be defined as a control range in principle. $\pm 0.5\Phi_0$ is equal to $1\Phi_0$ in magnitude (corresponding to one period), thus making it possible to cover a full range. In principle, FLL operation can be made.

However, in the case where the control range is defined as $\pm 0.5\Phi_0$, a lock point shift occurs due to an external noise as shown in FIG. 5(c) or due to a change of a signal at a point S or its vicinity at which a lock point as shown in FIG. 5(b) is shifted. In this case, there is a problem that a stable operation cannot be made. In a circuit operation at the time of a lock point change, as shown in FIG. 5(b), there is a need for frequently changing from a positive large value to a negative large value, i.e., from a maximum value to a minimum value. Thus, the operation becomes unstable. In particular, there is a problem that, in a large noise environment or in the case where a signal frequently changes in the vicinity of a change point S, a frequent lock point change occurs.

In the present invention, two or more counters, for example, a change rate counter and a reproduction counter, are provided. Then, a change rate counter inside the digital FLL handles only a change rate of measurement data, and a reproduction counter of a control computer processes an actual frequency of measurement data, i.e., periodic property of a magnetic field.

In addition, the control range is defined as $\pm(0.5\Phi_0+\alpha)$ by utilizing the periodic property of SQUID V–$\Phi$ characteristics. As a result, a high resolution is achieved, and then, an operation is stabilized by providing hysteresis characteristics.

A first embodiment of the present invention provides a magnetic flux measuring apparatus which measures a magnetic field in accordance with an FLL system by using a SQUID for generating a voltage that periodically fluctuates at a period of a magnetic flux quantum $\Phi_0$ on the basis of an increase of a magnetic field, the apparatus comprising:

an amplifier which amplifies a periodic output voltage from the SQUID, and outputs an amplified analog signal;

an AD converter which converts the amplified analog signal to a digital signal;

an integrator which, on the basis of an output of the AD converter, generates integral data that corresponds to a magnetic flux change component from a predetermined lock point for each period, lock points sequentially shifting to next lock points if the magnetic flux exceeds control ranges corresponding to the lock points, the integrator being controlled to be reset;

a change rate counter which is connected to the integrator and counts the number of the resets;

a data merge unit which merges the integral data and data on the number of resets; and a data demerge unit which receives merged data transmitted from the data merge unit via a predetermined transmission channel, and demerges the merged data into the integral data and the data on the number of resets;

a reproducing counter which counts a frequency that corresponds to a magnetic flux to be measured, based on the demerge data on the number of resets; and a data reproducing unit which measures a magnetic flux value on the basis of data for the integrator and the counted frequency.

In addition, in this magnetic flux measuring apparatus, at least the integrator, the change rate counter, and the data merge unit are formed in a microcomputer, and the data demerge unit, the reproducing counter, and the data reproducing unit are formed in a control computer. Further, a feedback current in an FLL system is reset in response to the reset of the integrator.

A second embodiment of the present invention provides a magnetic flux measuring apparatus which measures a magnetic field in accordance with an FLL system by using a SQUID for generating a voltage that fluctuates periodically on the basis of an increase of a magnetic field, the apparatus comprising:

an amplifier which amplifies a periodic output voltage from the SQUID, and outputs an amplified analog signal;

an AD converter which converts the amplified analog signal to a digital signal;

an integrator which, on the basis of an output of the AD converter, generates integral data that corresponds to a magnetic flux change component from a predetermined lock point for each period, lock points sequentially shifting to next lock points if the magnetic flux exceeds control ranges corresponding to the lock points, the integrator being controlled to be reset;

a change rate counter which is connected to the integrator and counts the number of the resets;

a reproducing counter which is connected to the change rate counter and counts a frequency that corresponds to a magnetic field to be measured, based on data on the number of resets; and a data reproducing unit which measures a magnetic flux value based on data for the integrator and the counted frequency.

In addition, in this magnetic flux measuring apparatus, at least the integrator and the change rate counter are formed in a microcomputer, and the reproducing counter and the data reproducing unit are formed in a control computer. Further, a feedback current in an FLL system is reset in response to the reset of the integrator.

Furthermore, a control range relevant to a predetermined lock point for said each period is $\pm(0.5\Phi_0+\alpha$ (where $\alpha$ is less than 0.5)), and $\alpha$ is set at a value greater than noise in a magnetic field to be measured.

Currently, a digital FLL magnetometer is hardly utilized in practice. This is mainly because this magnetometer is expensive. In the present invention, by using two or more counters, high performance of a SQUID magnetometer can be achieved using a stable, low-bit microcomputer. In addition, a high resolution can be achieved by narrowing a control range. In this case, a change point of a lock point is defined as $\pm(0.5\Phi_0+\alpha)$, thereby providing hysteresis characteristics. In signal variation near a lock point change as well, only one change of a lock point occurs. Even in the case where a noise level is high, a stable operation has been successfully made.

DETAILED DESCRIPTION OF THE INVENTION

Hereinafter, embodiments of the present invention will be described in detail with reference to specific examples shown in the accompanying drawings. An embodiment relating to the present invention will be described below. It is an object of the present invention to understand a general principle. Therefore, the present invention is not limited to only a configuration specifically described in the embodiment.

Figure 3:
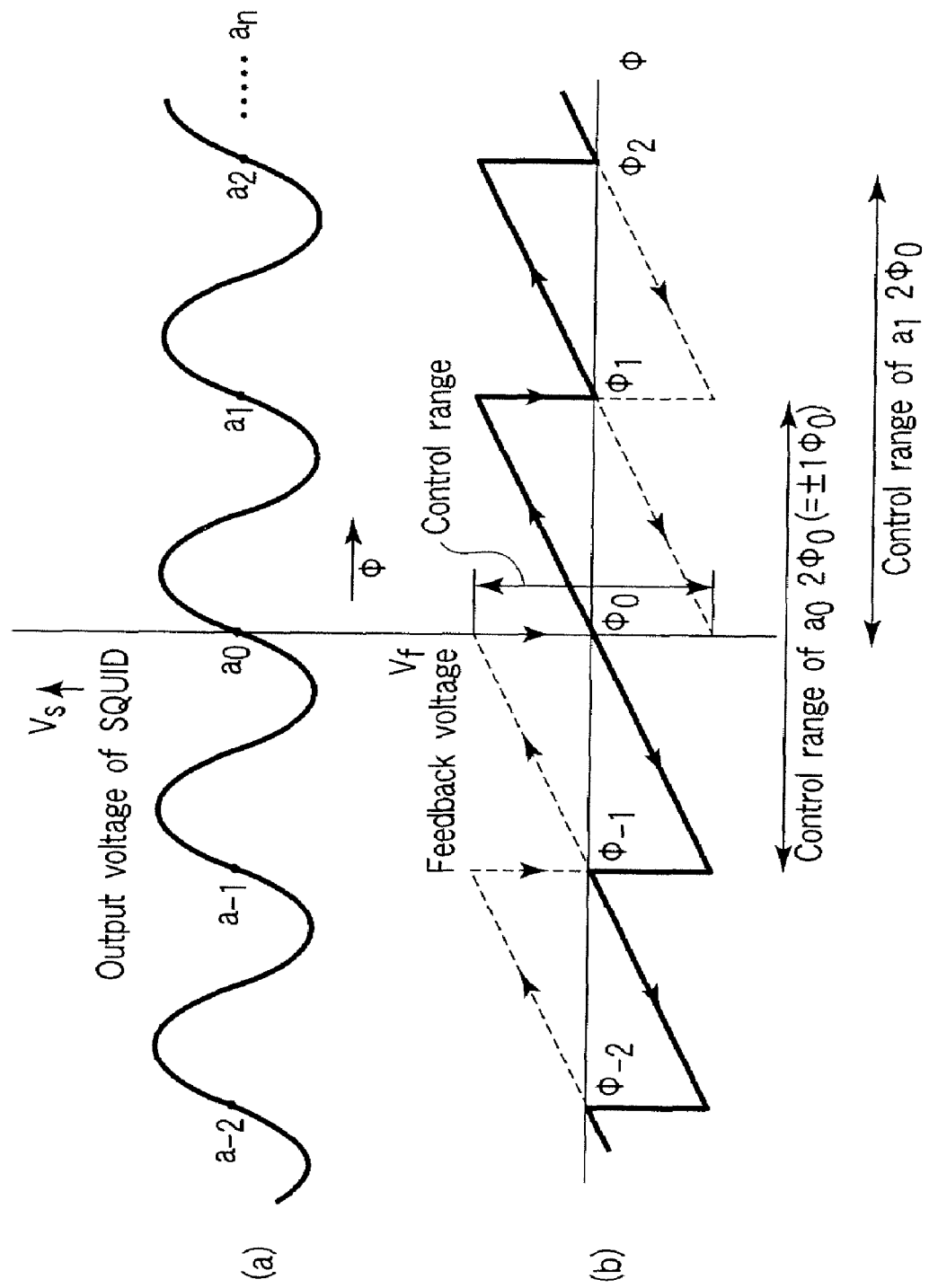
FIG. 3 shows a movement state of a control range at each lock point in a digital FLL technique.
Figure 4:
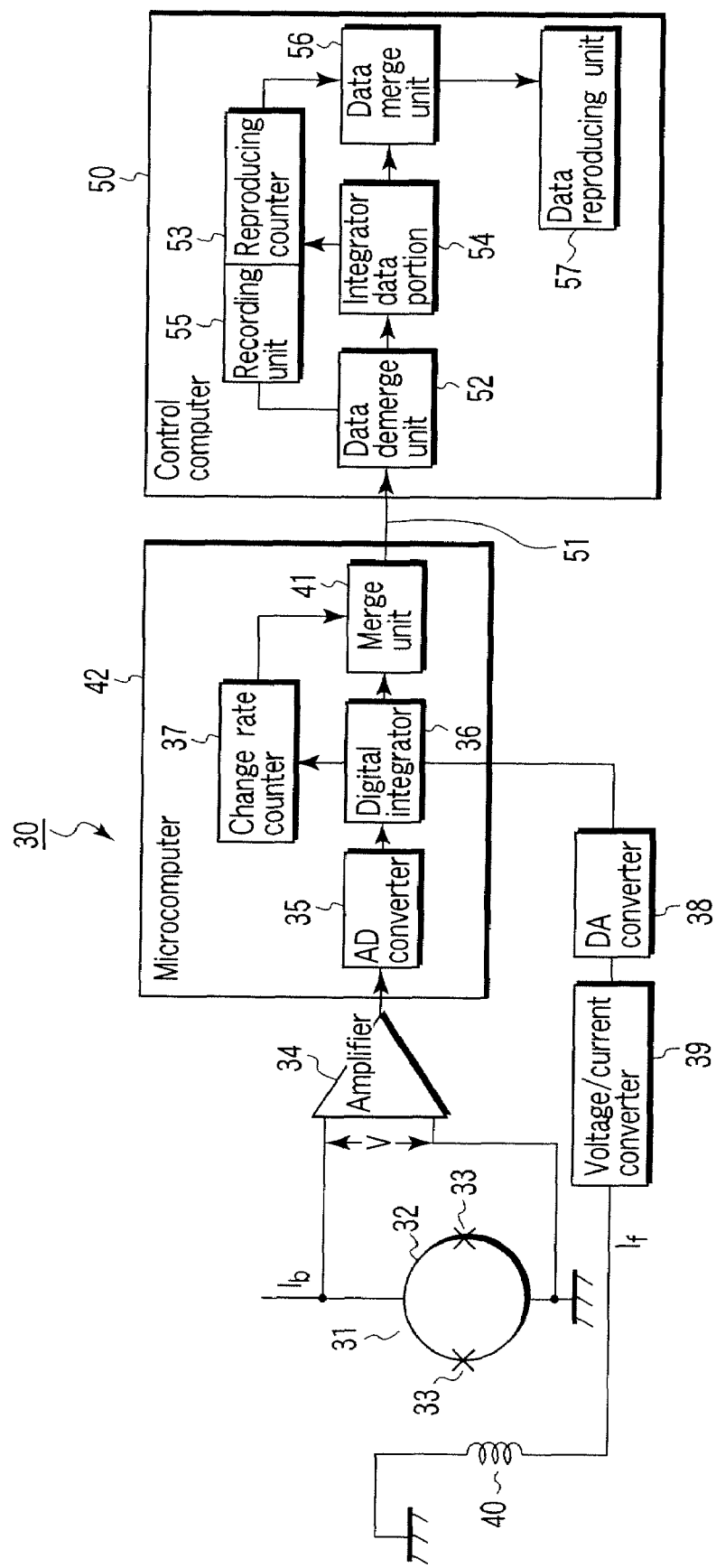
FIG. 4 shows a circuit diagram of a SQUIID magnetometer in a first embodiment of the present invention.

FIG. 4 shows a dcSQUID magnetometer 30 in accordance with a first embodiment of the present invention. As shown in FIG. 3, a SQUID 31 has a structure in which two Josephson junctions 33 have been provided partway of a ring 32 made of a superconducting material. For example, in the case of the SQUID using a high temperature superconducting material, a typical superconducting loop is formed to have thickness equal to or smaller than 1 μm, for example, to have a thin film of 0.2 μm. In addition, two junctions weak in a superconducting manner, each of which has a width of 3 μm, for example, i.e., Josephson junctions 33 are provided.

In general, the SQUID 31 is biased by a direct current Ib from a direct current power supply (not shown). In such a SQUID 31, a voltage (output voltage V) between an input unit and an output unit of a bias current changes due to an external magnetic flux $\Phi x$ that penetrates the ring 32 of the SQUID.

An output of the SQUID 31 is connected to an amplifier 34, and an output of the amplifier is connected to an AD converter 35. An output voltage V of the SQUID 31 based on the external magnetic flux is amplified to a proper magnitude by means of the amplifier 34, and then, conversion to digital data is carried out by means of the AD converter 35 connected to the output of the amplifier 34.

In an embodiment of FIG. 4, the resolution of the AD converter 35, i.e., the number of operating bits may be a comparatively small number, for example, may be about 10 bits. This is because there occurs a difference between the external magnetic flux $\Phi x$ and an elimination magnetic flux from a feedback coil 40. Namely, this is because only a change rate is AD-converted.

An output of the AD converter 35 is connected to a digital integrator 36, and the digital integrator 36 is connected to a change rate counter 37, a DA converter 38 that configures a feedback circuit, and a data merge unit 41. The AD converter 35, the digital integrator 36, the change rate counter 37, and the data merge unit 41 can be formed using a microcomputer 42, without being limited to this method. As one example, in the microcomputer 42, these elements are processed in 16 bits. In addition, as another example, the digital integrator 36, the change rate counter 37, and the data merge unit 41 can be formed in the microcomputer 42, and the AD converter 35 can be externally provided. As the microcomputer 42, a so called one-chip microcomputer can be used.

Figure 1:
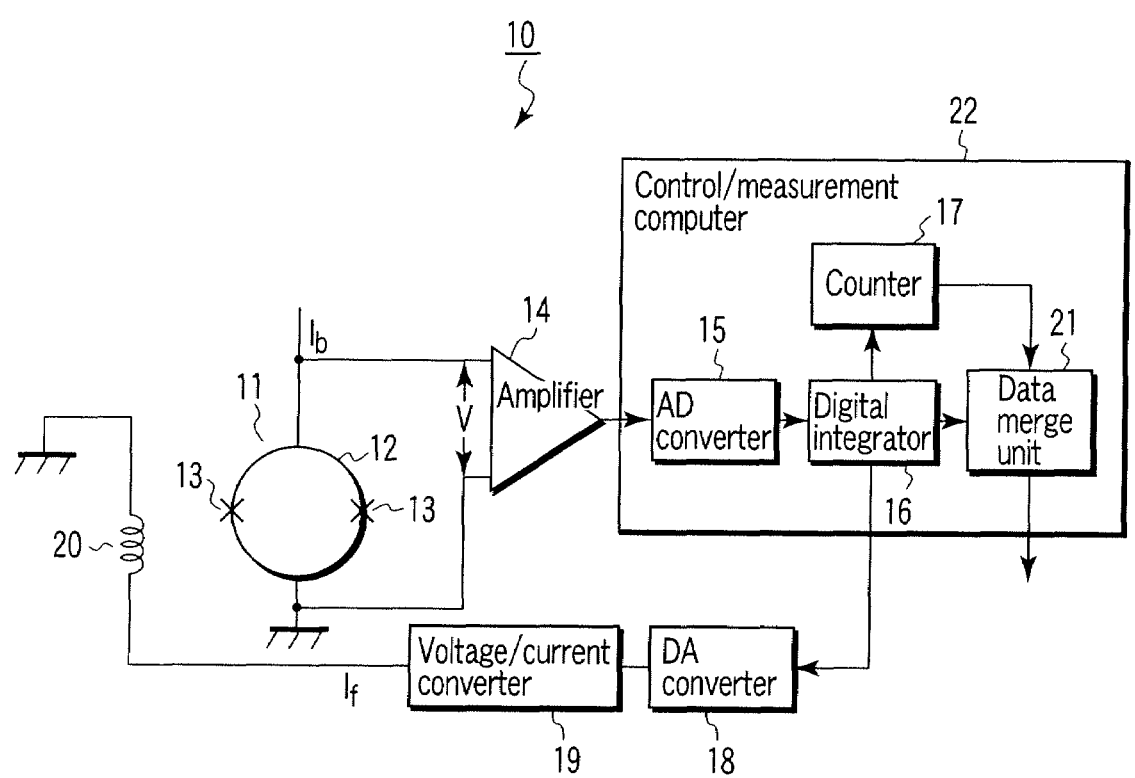
FIG. 1 is a circuit diagram of a dcSQUID magnetometer configured using a digital FLL technology.
Figure 2:
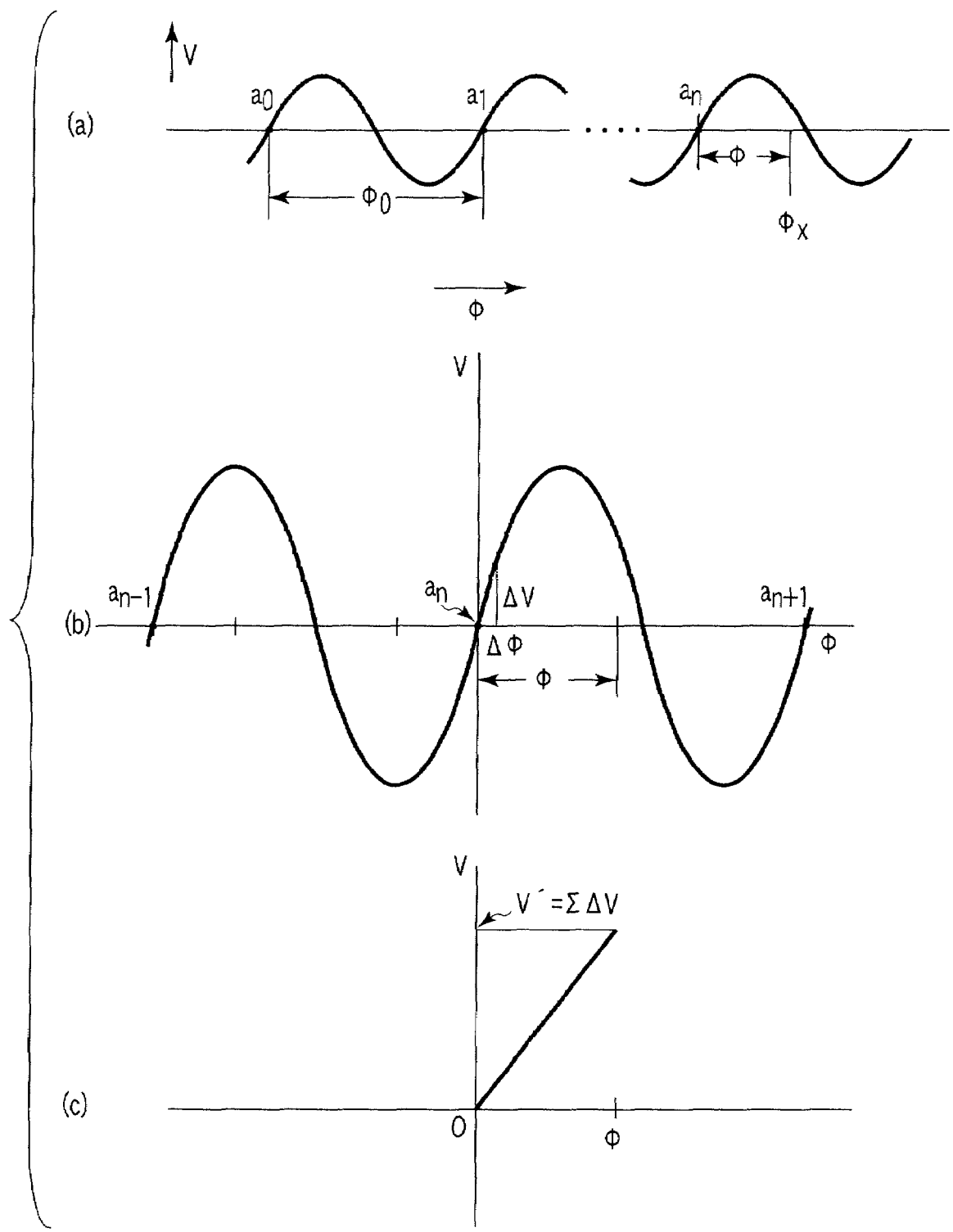
FIG. 2 shows a relationship between an external magnetic flux and an output voltage in SQUID and shows the content of an integrating process at a lock point.

The digital integrator 36 integrates an output voltage $\Delta V$ that corresponds to a magnetic flux change $\Delta\Phi$ in the control range of lock points ($a_0, a_1, a_2, \ldots$) shown in FIG. 3, for example. For example, as shown in FIG. 2(b), the digital integrator 36 integrates a change component $\Delta v$ of an output voltage that corresponds to a magnetic flux change component $\Delta\Phi$ from a lock point "$a_n$", and then, always feeds back its output to the feedback coil 40 via the DA converter 38 and a voltage/current converter 39. Thus, a microscopic measurement point is fixed to the lock point $a_n$ one after another, and a change $\Delta v$ of an output voltage based on a change $\Delta\Phi$ of a magnetic flux at the time of each measurement becomes always constant. Therefore, by carrying out integration using the digital integrator 36, linear output data relevant to a change of the magnetic flux $\Phi$ in each control range can be obtained. If the digital integrator 35 exceeds the control range of a certain lock point ($a_0$ in FIG. 3(b), for example) at which integration has been executed, an integral value is reset, and the current lock point moves to a next lock point ($a_1$ in FIG. 3(b), for example).

Current feedback quantity to the SQUID 31 is determined by integrating a voltage change component $\Delta V$ using the digital integrator 36, as described above. An integral value outputted from the digital integrator 36 is converted to an analog value by means of the DA converter 38. Then, the analog converted integral value is sent to the voltage/current converter 39. The voltage/current converter 39 is provided as a converter for generating a predetermined feedback current "If" based on a measured voltage (above analog value) caused by a change of an external magnetic field. The predetermined feedback current "If" is fed to generate a magnetic field such that magnetic flux changes from lock points each are eliminated. A value of the feedback current value "If" is determined by means of the microcomputer 42, for example, in consideration of the shape or allocation and ratio of coupling of the ring 32 or the feedback coil 40.

In the present embodiment, the number of bits of the integrator 36 determines the resolution of the SQUID magnetometer 30. With respect to the DA converter 38, a total price thereof can be reduced utilizing a plurality of inexpensive DA converters having a small number of bits, for example (by using two 8-bit DA converters in parallel, for example).

Figure 5:
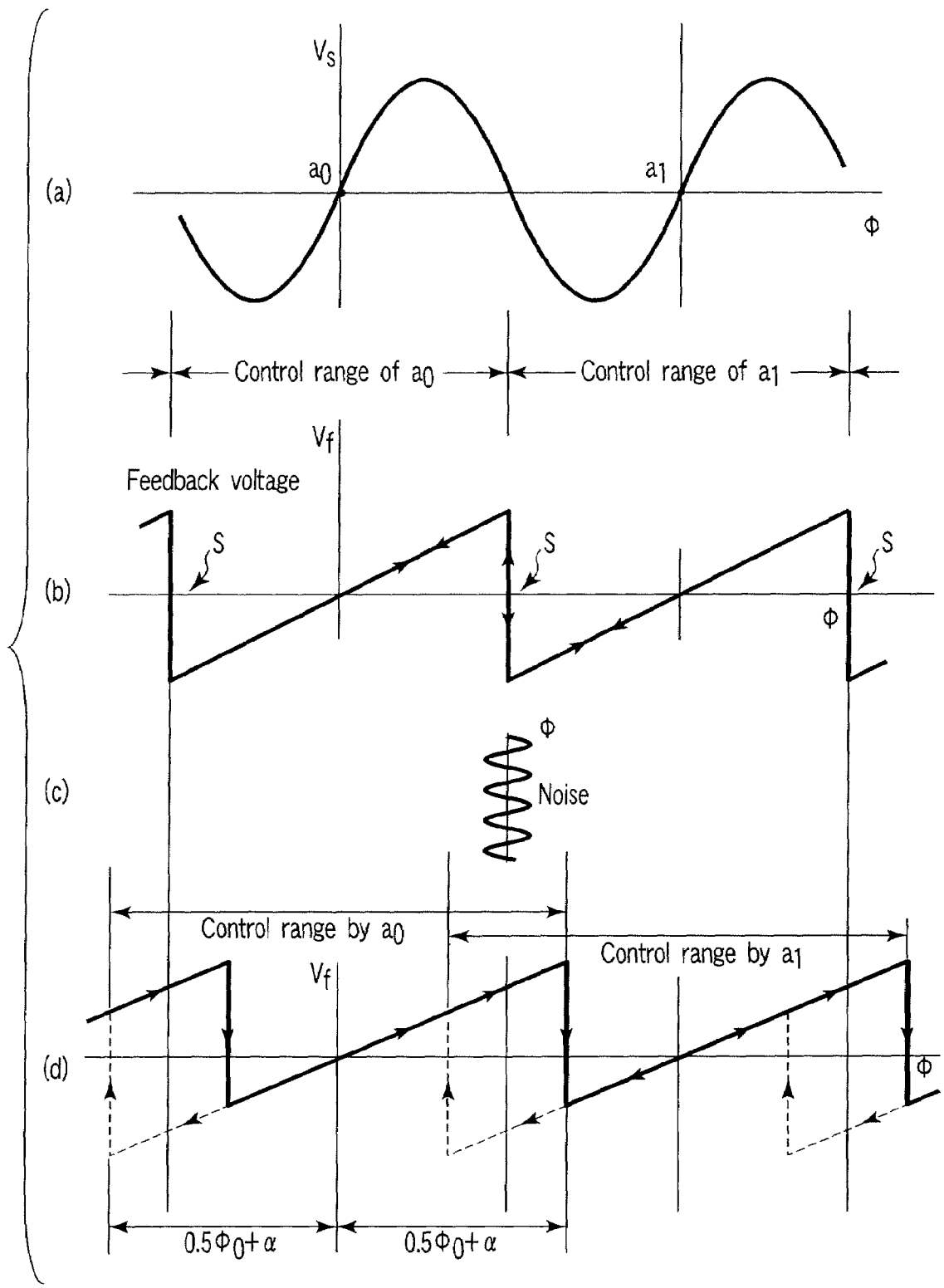
FIG. 5 shows a movement state of a control range at each lock point having hysteresis characteristics in the present invention.

The digital integrator 36 is connected to the change rate counter 37 and the DA converter 38. The digital integrator 36 sends to the DA converter 38 and the data merge unit 41 an integral value that corresponds to a magnetic flux change in the control range as shown in FIGS. 3(b) and 5(d) which is described later. In the case where the control range relevant to a lock point at which a magnetic flux Φ is active has been exceeded, the microcomputer 42 makes control such that the control range of a lock point $a_0$ is shifted to the next control range according to a lock point $a_1$, in accordance with a periodic property of the Φ–V characteristics as shown in FIG. 3(a). By such shifting, the feedback current "If" can be restrained to be equal to or smaller than a predetermined value. This shifting is carried out in accordance with a command from a control unit (not shown) in the microcomputer 42, for example, and then, the change rate counter 37 counts the number of shifts.

An operation of a feedback circuit from the digital integrator 36 to the feedback coil 40 via the DA converter 38 is carried out at a high speed. In contrast, data transmission to a control computer 50 described later is carried out at a low speed of about 1 kHz, for example, that is a sampling rate required for measurement of a magnetic flux. Thus, the change rate counter 37 counts the number of shifts caused by a magnetic flux change until next data transmission and holds its change rate.

In this way, the change rate counter 37 serves to count how many shifts have occurred, i.e., how much a lock point ($a_0$, $a_1$, $a_2$, . . . in FIG. 5(a)) has moved, while data is transferred to the control computer 50 that follows. When data is transferred to the control computer 50, the change rate counter 37 is reset to zero. The data merge unit 41 produces a transmission signal by combining the number of the above shifts measured by the change rate counter 37 and an integral value of the integrator 36. A processing operation from the SQUID 31 to the integrator 36 is carried out at a high speed independently of data transfer that follows, and a processing speed can be increased. Control of the AD converter 35, the digital integrator 36, the change rate counter 37, and the data merge unit 41 is carried out by means of a control unit (not shown) in the microcomputer 42.

At a timing of data communication of the transmission channel 51, a transmission signal outputted from the data merge unit 41 having data for the integrator 36 and data for the change rate counter 37 is transferred to the control computer 50. As the control computer 50, there can be used a terminal equipped with a general control unit, a logic calculating unit, an information recording unit, a display unit, a keyboard serving as an input unit (not shown) and the like, for example, a commercially available personal computer and the like. In a general measuring system, a data transfer speed is the largest cause that makes lowers a system processing speed. In order to solve this problem, in the present invention, two counters 37 and 53 are used to divide a change rate data processing operation and a data processing operation relevant to an actual magnetic flux.

In the control computer 50, measurement data for an actual magnetic flux is generated based on data for the integrator 36 and data for the change rate counter 37 according to the received data. Even in the case where a currently commercially available general-purpose personal computer has been used in accordance with such a method, a very large dynamic range can be achieved.

The data merge unit 41 forms a transmission signal by combining a change rate of a lock point from the change rate counter 37 and an integral value from the integrator 36, and then, outputs the transmission signal to a data communication channel 51.

A data demerge unit 52 demerges the transmitted data into the data for the change rate counter 37 and the data from the integrator 36; sends the data for the change rate counter 37 to a reproducing counter 53; and sends the data for the integrator 36 to an integrator data portion 54. Although 32 bits are utilized as a variable, a plurality of 32-bit variables can be utilized in a program (100 or more variables can be easily utilized), and thus, these variables are equal to be infinite in practice. In addition, in 64 bits using two 32-bit variables in practice, the range of 1000 T (Wb/m$^2$) can be measured (a variable coefficient of the SQUID is equivalent to 1 nT per 1Φ$_0$).

A recording unit 55 is provided in the reproducing counter 53, and all of the data for the change rate counter 37 from the start of measurement and subsequent is recorded therein. Then, the reproducing counter 53 sums the data for the change rate counter 37 sent from the microcomputer 42. This conversion value data corresponds to the number of times a lock point has been passed, and thus, corresponds to a so called significant bit of the data for the actual magnetic flux Φ obtained after measurement has been started.

The integrator data portion 54 stores an integral value of the integrator 36 demerged, i.e., integral value data that corresponds to a value of a magnetic flux from a last lock point $a_n$. This value corresponds to the least significant bit for expressing the data for the actual magnetic flux. The above two items of data are merged with each other in a data merge 56, and an actual magnetic flux value is calculated in a data reproducing unit 57.

Specifically, for example, the integrator 36 is formed in 16 or more bits, the change rate counter 37 is formed in 8 bits, and the reproducing counter is formed in 32 bits or 64 bits.

This method is featured in that a current feedback process for FLL operation is carried out independently of data transfer via the transmission channel 51. The change rate counter 37 is provided independently of the reproducing counter 53, thereby making it possible to prevent the lowering of a processing speed of the FLL feedback process caused by low speed data transfer as compared with an FLL operation and achieve high speed feedback. By utilizing the reproducing counter 53 of the control computer 50, a much larger number of bits can be used as compared with utilization of a counter only in a digital FLL, and a dynamic range can be substantially broadened. Therefore, a high speed data processing operation and a dynamic range improvement can be achieved.

In addition, in a system of the present invention, an AD converter and a counter can be configured utilizing an inexpensive microcomputer and a control computer is utilized as a second counter, thus making it possible to provide a whole system inexpensively without higher cost.

Now, a description will be given with respect to improvement of resolution in this measuring system. The resolution of the system is determined depending on the control range and the number of bits for control. It is necessary to narrow the control range in order to improve the resolution in the case where the number of bits is constant.

Conventionally, in order to perform a stable operation, $\pm 1\Phi_0$ (corresponding to two period) has been defined as a control range with respect to each lock point, as shown in FIG. 3(b). However, in the digital FLL, as shown in FIGS. 5(a) and 5(b), the full measurement range can be covered in principle by defining $\pm 0.5\Phi_0$ as the control range. That is, $\pm 0.5\Phi_0$ is equal to $1\Phi_0$ in magnitude (corresponding to one period), and thus, the full range can be covered, and FLL operation can be made in principle.

However, there is a problem that, in the case where $\pm 0.5\Phi_0$ is defined as the control range, a lock point shift occurs due to an external noise as shown in FIG. 5(c) or a change of a signal, at a point S or its vicinity at which a lock point as shown in FIG. 5(b) is shifted to a next point, thereby disabling a stable operation. With respect to a circuit operation at the time of a lock point change, it is necessary to change a positive large value to a negative large value, i.e., a maximum value to a minimum value, as shown in FIG. 5(b). If this change frequently occurs, an operation becomes unstable. In a noisy environment or in the case where a signal frequently changes in the vicinity of a change point of a lock point, a frequent change of a lock point occurs.

In order to avoid such a situation, as shown in FIG. 5(d), an operating range is defined as $\pm 0.6\Phi_0$ by providing a margin $\alpha$ less than $0.5\Phi_0$, for example $0.1\Phi$, to $\pm 0.5\Phi_0$, and hysteresis characteristics for stabilizing an operation can be provided. It has been found that a frequent lock point shift can be prevented by adding such margin $\alpha$. Although an object of the present invention is to increase resolution, a stable operation can be obtained even in the case where the control range is narrowed to $\pm(0.5\Phi_0+\alpha)$ by using such hysteresis characteristics.

In this case, the integrator 36 integrates the data AD-converted by means of the AD converter 35. Then, only in the case where $\pm(0.5\Phi_0+\alpha)$ has been exceeded, the information is sent to the change rate counter 37, and the integral value is reset. An integrated value (data) is always sent to the DA converter 38. The feedback coil 40 produces a feedback magnetic field based on this value, and fixes the magnetic field in the SQUID 31 to a lock point. In the case where $\pm(0.5\Phi_0+\alpha)$ has been exceeded, the integrator 36 is reset, and then, a value after reset is sent to the DA converter 38.

In this way, in the case of utilizing the periodic property of the V–Φ characteristics of the SQUID 31, high resolution is achieved and an operation can be stabilized as compared with the past control range ($\pm 1\Phi_0$), in accordance with a method for adding the margin $\alpha$ to one period of the control range to make the range $\pm(0.5\Phi_0+\alpha)$, thereby providing hysteresis characteristics. The control range is specified in accordance with a program of the microcomputer 42.

Figure 6:
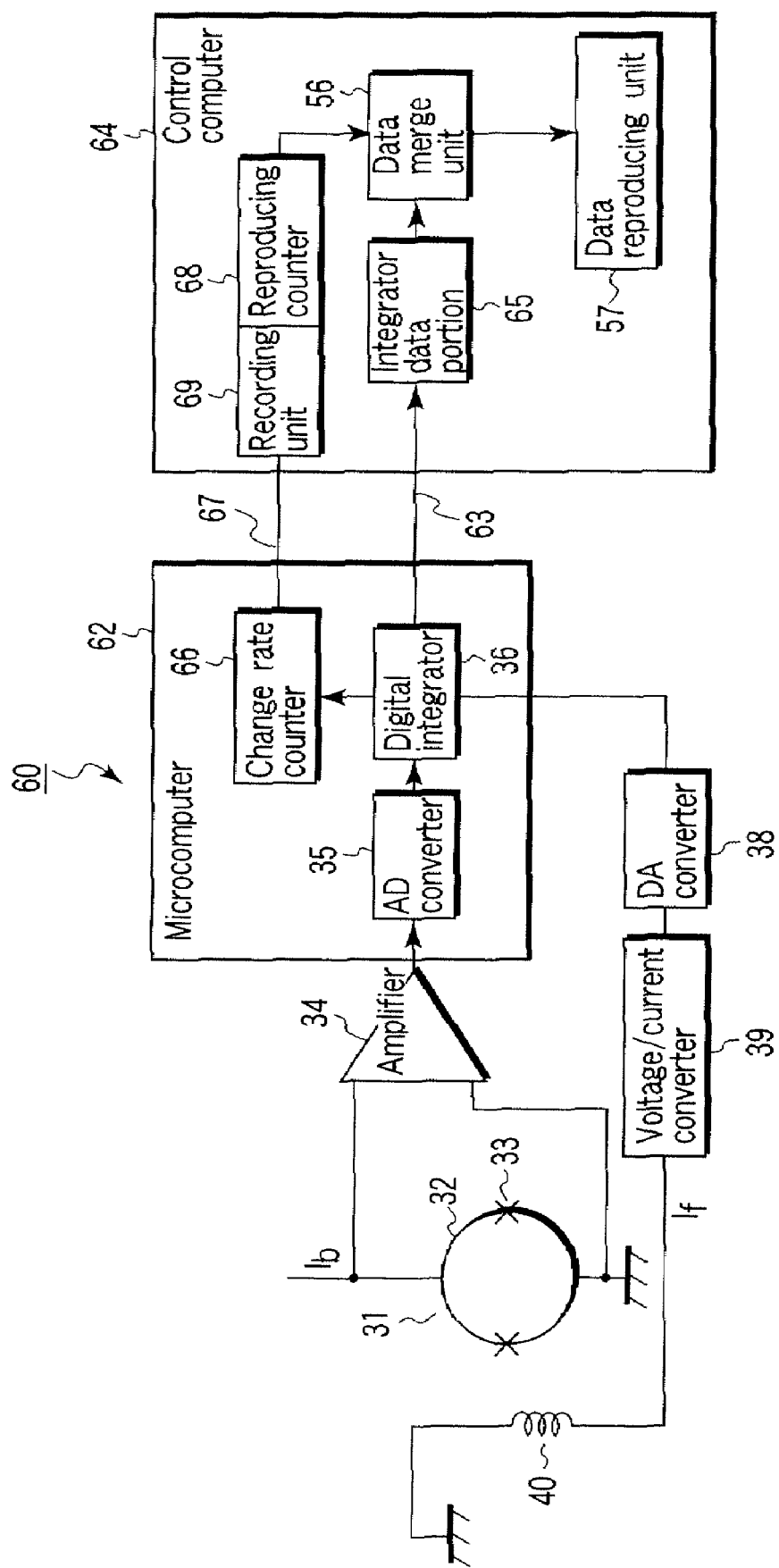
FIG. 6 is a circuit diagram of a SQUID magnetometer in a second embodiment of the present invention.

A dcSQUID magnetometer 60 according to a second embodiment of the present invention will be described with reference to FIG. 6 SQUID 31, a ring 32, a Josephson junction 33, an amplifier 34, an AD converter 35, a digital integrator 36, a DA converter 38, a voltage/current converter 39, a feedback coil 40, and a data merge unit 56 and a data reproducing unit 57 that configure an FLL unit are designated by like reference numerals, because these elements are identical to those in the case of the first embodiment.

Although the content of an integrating process of the integrator 36 in a microcomputer 62 is identical to that in the case of the first embodiment, its output is directly inputted at a timing of sampling to an integrator data portion 65 in a control computer 64 via a transmission channel 63. Although the processing content of a change rate counter 66 is also identical to that in the case of the first embodiment, its output is inputted to a recording unit 69 of a reproducing counter 68 in the control computer 64 at a timing of sampling via a transmission channel 67. The reproducing counter 68 reproduces data in accordance with the number of period in a magnetic flux to be measured; the above two items of data are merged in the data merge unit 56 at this timing; and then, an actual magnetic flux value is calculated in the data reproducing unit 57. As the control computer 64, there can be used a terminal similar to the control computer according to the first embodiment, for example, a commercially available personal computer or the like.

According to the method of the present invention, even if a lock point is changed at a position for determining how much external magnetic field is measured to shift the lock point, a correct measuring magnetic field can be obtained by counting the number of changes at that lock point. In addition, a dynamic range can be broadened without lowering measurement resolution. In accordance with such a method, a dynamic range can be remarkably broadened without increasing a dynamic current value.

A digital FLL according to the present invention stably operates even in an environment free from magnetic shield room or in a ferromagnetic space such as an MRI (Magnetic Resonance Imaging). Thus, the restriction on an installation site of an SQUID magnetometer would be eliminated, and the applicability of a high resolution magnetometer would be broadened remarkably. In addition, this digital FLL can also be applied to MRI technique utilizing the SQUID magnetometer.

While the embodiments of the present invention have been described by way of illustrative example, it is evident that various modifications can occur without departing from the technical scope of the present invention.

The present invention is not limited to the embodiments described above. At its embodying stage, the present invention can be variously modified without departing from the spirit of the invention.

What is claimed is:

1. A magnetic flux measuring apparatus which measures a magnetic field in accordance with an FLL system by using a SQUID for generating a voltage that periodically fluctuates at a period of a magnetic flux quantum $\Phi_0$ on the basis of an increase of a magnetic field, the apparatus comprising:

an amplifier which amplifies a periodic output voltage from the SQUID, and outputs an amplified analog signal;

an AD converter which converts the amplified analog signal to a digital signal;

an integrator which, on the basis of an output of the AD converter, generates integral data that corresponds to a magnetic flux change component from a predetermined lock point for each period, lock points sequentially shifting to next lock points if the magnetic flux exceeds control ranges corresponding to the lock points, the integrator being controlled to be reset;

a change rate counter which is connected to the integrator and counts the number of the resets;

a data merge unit which merges the integral data and data on the number of resets; and a data demerge unit which receives merged data transmitted from the data merge unit via a predetermined transmission channel, and demerges the merged data into the integral data and the data on the number of resets;

a reproducing counter which counts a frequency that corresponds to a magnetic flux to be measured, based on the demerged data on the number of resets; and a data reproducing unit which measures a magnetic flux value on the basis of data for the integrator and the counted frequency.

2. The magnetic flux measuring apparatus according to claim 1, wherein at least the integrator, the change rate counter, and the data merge unit are formed in a microcomputer, and the data demerge unit, the reproducing counter, and the data reproducing unit are formed in a control computer.

3. The magnetic flux measuring apparatus according to claim 1, wherein a feedback current in an FLL system is reset in response to the reset of the integrator.

4. A magnetic flux measuring apparatus which measures a magnetic field in accordance with an FLL system by using a SQUID for generating a voltage that fluctuates periodically on the basis of an increase of a magnetic field, the apparatus comprising:

an amplifier which amplifies a periodic output voltage from the SQUID, and outputs an amplified analog signal;

an AD converter which converts the amplified analog signal to a digital signal;

an integrator which, on the basis of an output of the AD converter, generates integral data that corresponds to a magnetic flux change component from a predetermined lock point for each period, lock points sequentially shifting to next lock points if the magnetic flux exceeds control ranges corresponding to the lock points, the integrator being controlled to be reset;

a change rate counter which is connected to the integrator and counts the number of the resets;

a reproducing counter which is connected to the change rate counter and counts a frequency that corresponds to a magnetic field to be measured, based on data on the number of resets; and a data reproducing unit which measures a magnetic flux value based on data for the integrator and the counted frequency.

5. The magnetic flux measuring apparatus according to claim 4, wherein at least the integrator and the change rate counter are formed in a microcomputer, and the reproducing counter and the data reproducing unit are formed in a control computer.

6. The magnetic flux measuring apparatus according to claim 4, wherein a feedback current in an FLL system is reset in response to the reset of the integrator.

7. The magnetic flux measuring apparatus according to any one of claims 1 to 6, wherein a control range relevant to a predetermined lock point for said each period is $\pm(0.5\Phi_0+\alpha$ (where $\alpha$ is less than 0.5)).

8. The magnetic flux measuring apparatus according to claim 7, wherein a control range relevant to a predetermined lock point for said each period is $\pm(0.5\Phi_0+\alpha)$, and $\alpha$ is set at a value greater than noise in a magnetic field to be measured.

* * * * *